(12) United States Patent
Shin

(10) Patent No.: US 12,205,758 B2
(45) Date of Patent: Jan. 21, 2025

(54) COIL COMPONENT

(71) Applicant: SAMSUNG ELECTRO-MECHANICS CO., LTD., Suwon-si (KR)

(72) Inventor: Sung Sik Shin, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 819 days.

(21) Appl. No.: 17/103,337

(22) Filed: Nov. 24, 2020

(65) Prior Publication Data

US 2022/0013282 A1 Jan. 13, 2022

(30) Foreign Application Priority Data

Jul. 10, 2020 (KR) ........................ 10-2020-0085322

(51) Int. Cl.
| | | |
|---|---|---|
| H01F 27/24 | (2006.01) | |
| H01F 19/04 | (2006.01) | |
| H01F 27/02 | (2006.01) | |
| H01F 27/29 | (2006.01) | |

(Continued)

(52) U.S. Cl.
CPC ............. *H01F 27/32* (2013.01); *H01F 19/04* (2013.01); *H01F 27/02* (2013.01); *H01F 27/24* (2013.01); *H01F 27/292* (2013.01); *H01F 27/306* (2013.01)

(58) Field of Classification Search
CPC .......... H01F 27/32; H01F 19/04; H01F 27/02; H01F 27/24; H01F 27/292; H01F 27/306; H01F 2017/048; H01F 17/04; H01F 27/40; H01F 27/33; H01F 17/0013;

(Continued)

(56) References Cited

U.S. PATENT DOCUMENTS

| | | | |
|---|---|---|---|
| 10,204,741 B2 | 2/2019 | Matsunaga | |
| 10,804,022 B2 * | 10/2020 | Ishida | ................. C22C 32/0015 |
| 2017/0063322 A1 * | 3/2017 | Matsunaga | ........... H01F 27/292 |

(Continued)

FOREIGN PATENT DOCUMENTS

| | | |
|---|---|---|
| JP | 2006-032860 A | 2/2006 |
| JP | 4479353 B2 * | 6/2010 |

(Continued)

OTHER PUBLICATIONS

Korean Office Action dated Nov. 29, 2024 issued in Korean Patent Application No. 10-2020-0085322 (with English translation).

*Primary Examiner* — Tuyen T Nguyen
(74) *Attorney, Agent, or Firm* — Morgan, Lewis & Bockius LLP

(57) ABSTRACT

A coil component includes a body including a core, a molded portion having a first surface and a second surface opposing each other and a side surface connecting the first surface and the second surface, and a cover portion disposed on the molded portion, first and second receiving grooves disposed in the first surface of the molded portion to be spaced apart from each other and disposed outside of a region corresponding to the core, in the first surface of the molded portion, a wound coil disposed between the molded portion and the cover portion, and wound around the core, and a first noise removing portion disposed between the wound coil and the second surface of the molded portion.

20 Claims, 16 Drawing Sheets

(51) Int. Cl.
*H01F 27/30* (2006.01)
*H01F 27/32* (2006.01)

(58) Field of Classification Search
CPC .... H01F 27/022; H01F 27/2804; H01F 27/30; H03H 2001/0057
See application file for complete search history.

(56) References Cited

U.S. PATENT DOCUMENTS

| | | |
|---|---|---|
| 2020/0006949 A1 | 1/2020 | Song et al. |
| 2020/0219651 A1 | 7/2020 | Kang et al. |

FOREIGN PATENT DOCUMENTS

| | | |
|---|---|---|
| KR | 10-2009-0019559 A | 2/2009 |
| KR | 10-2017-0026135 A | 3/2017 |
| KR | 10-2020-0001282 A | 1/2020 |
| KR | 10-2130677 B1 | 7/2020 |

\* cited by examiner

COIL COMPONENT

CROSS-REFERENCE TO RELATED APPLICATION(S)

This application claims the benefit under 35 USC 119 (a) of Korean Patent Application No. 10-2020-0085322 filed on Jul. 10, 2020 in the Korean Intellectual Property Office, the entire disclosure of which is incorporated herein by reference for all purposes.

TECHNICAL FIELD

The present disclosure relates to a coil component.

BACKGROUND

Inductors, as coil components, are representative passive electronic components used in electronic devices, along with resistors and capacitors.

As electronic devices have become increasingly better in terms of performance, and smaller, electronic components used in electronic devices are increasing in number and are being miniaturized in size.

For the above-described reasons, demands for removing noise such as electromagnetic interference (EMI) are gradually increasing, even in wound coil components.

SUMMARY

Exemplary embodiments provide a coil component from which noise may be easily removed.

According to an embodiment, a coil component includes a body including a core, a molded portion having one surface and an other surface opposing each other and a cover portion disposed on the molded portion, first and second receiving grooves disposed in the one surface of the molded portion to be spaced apart from each other and disposed outside of a region corresponding to the core, in the one surface of the molded portion, a wound coil disposed between the molded portion and the cover portion, and wound around the core, in such a manner that both ends of the wound coil are disposed in the first and second receiving grooves, respectively, and a first noise removing portion disposed between the wound coil and the other surface of the molded portion, in such a manner that one end of the first noise removing portion is exposed to the one surface of the molded portion.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
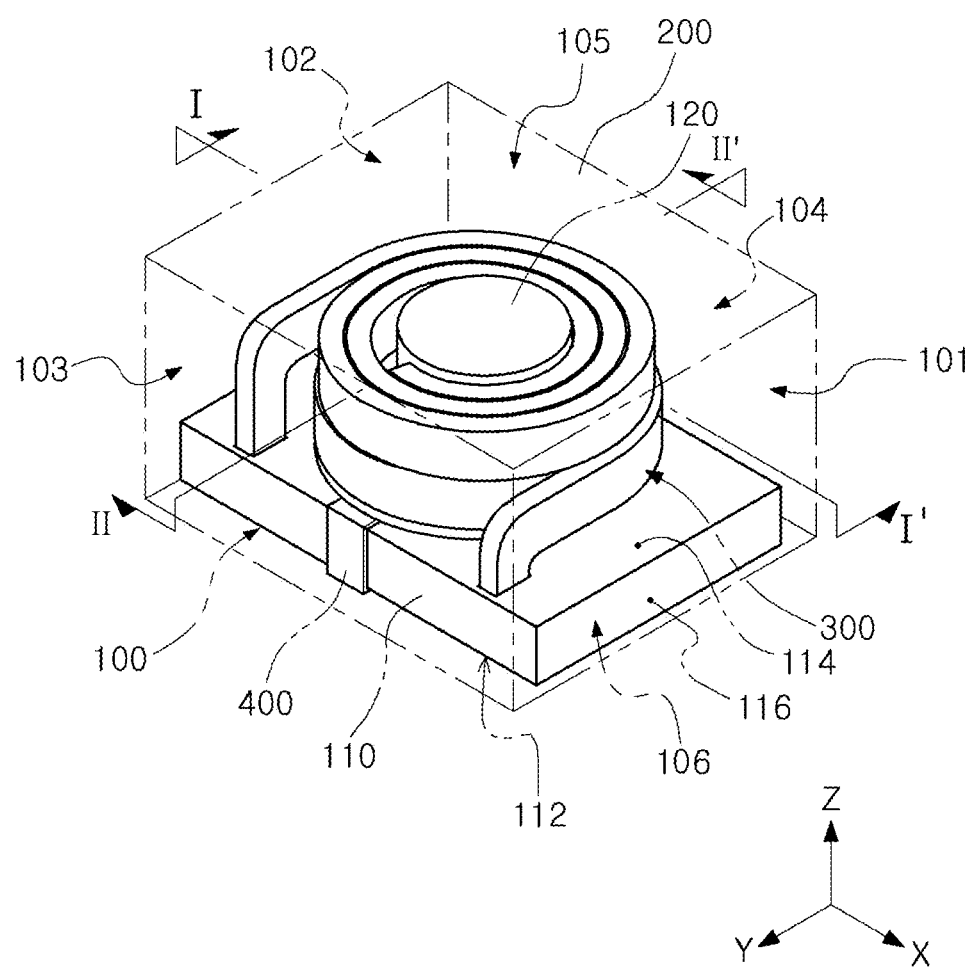
FIG. 1 is a view schematically illustrating a coil component according to a first embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an embodiment or example, e.g., as to what an embodiment or example may include or implement, means that at least one embodiment or example exists in which such a feature is included or implemented while all examples and examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly. Throughout the specification, the term "on" means to be positioned above or below the target portion, and does not necessarily mean to be positioned above the direction of gravity.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after gaining an understanding of the disclosure of the present disclosure. Further, although the examples described herein have a variety of configurations, other configurations are possible as will be apparent after an understanding of the disclosure of the present disclosure.

The drawings may not be to scale, and the relative sizes, proportions, and depiction of elements in the drawings may be exaggerated for clarity, illustration, and convenience.

Since the sizes and thicknesses of respective components illustrated in the drawings are arbitrarily illustrated for convenience of description, the present disclosure is not necessarily limited to the illustration of the drawings.

In the drawings, the X direction may be defined as a first direction or a length direction, the Y direction may be defined as a second direction or a width direction, and the Z direction may be defined as a third direction or a thickness direction.

Hereinafter, a coil component according to an embodiment will be described in detail with reference to the accompanying drawings, and in the description with reference to the accompanying drawings, the same or corresponding components are assigned the same reference numbers and overlapped descriptions thereof are omitted.

Various types of electronic components are used in electronic devices, and various types of coil components may be appropriately used between the electronic components, to remove noise or the like.

For example, coil components in electronic devices may be used as power inductors, high frequency inductors (HF inductors), general beads, high frequency beads (GHz beads), common mode filters, or the like.

First Embodiment

Figure 2:
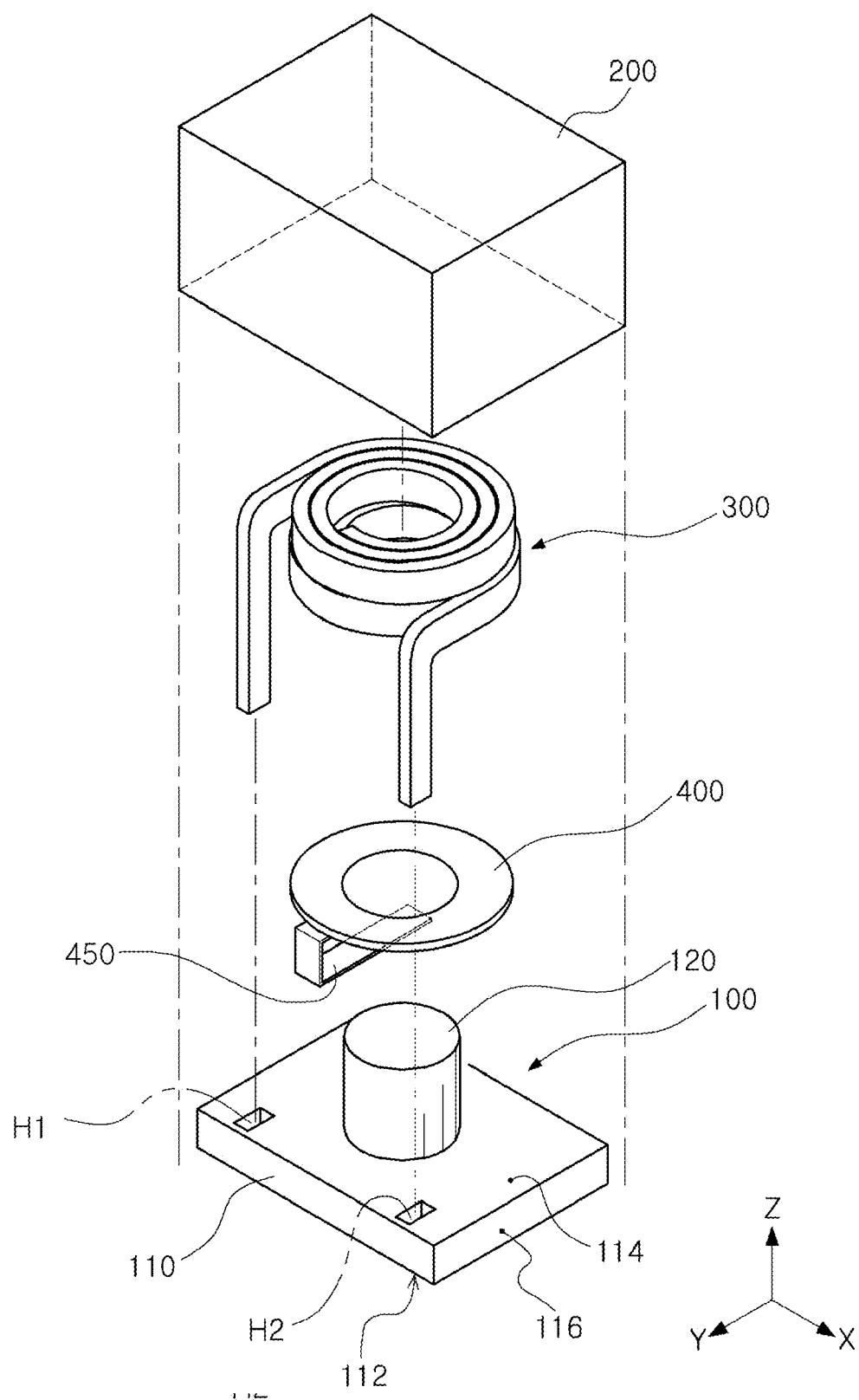
FIG. 2 is an exploded perspective view of FIG. 1.
Figure 3:
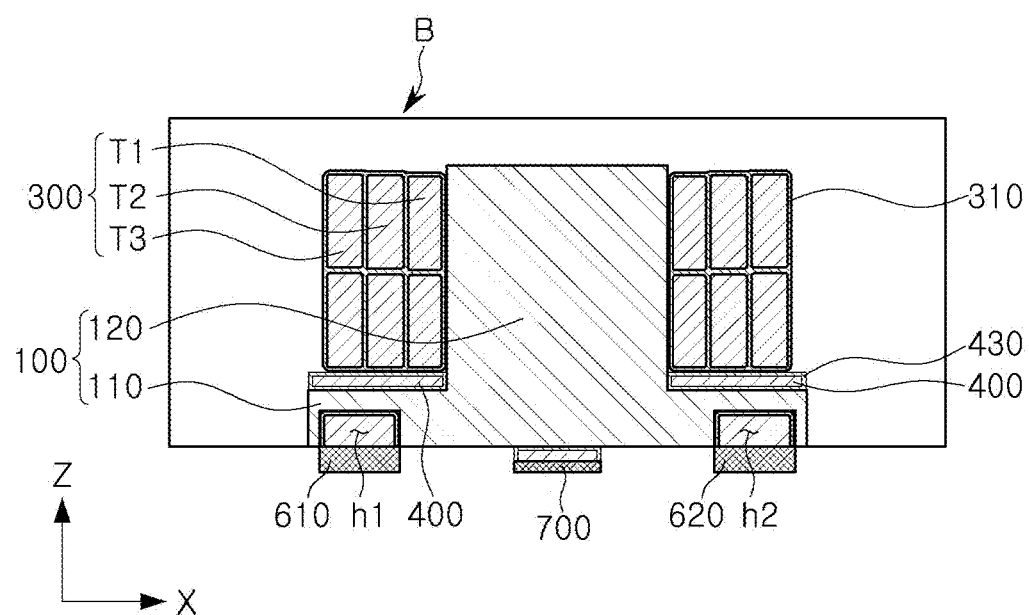
FIG. 3 is a view illustrating a cross-sectional view taken along line I-I' of FIG. 1.
Figure 4:
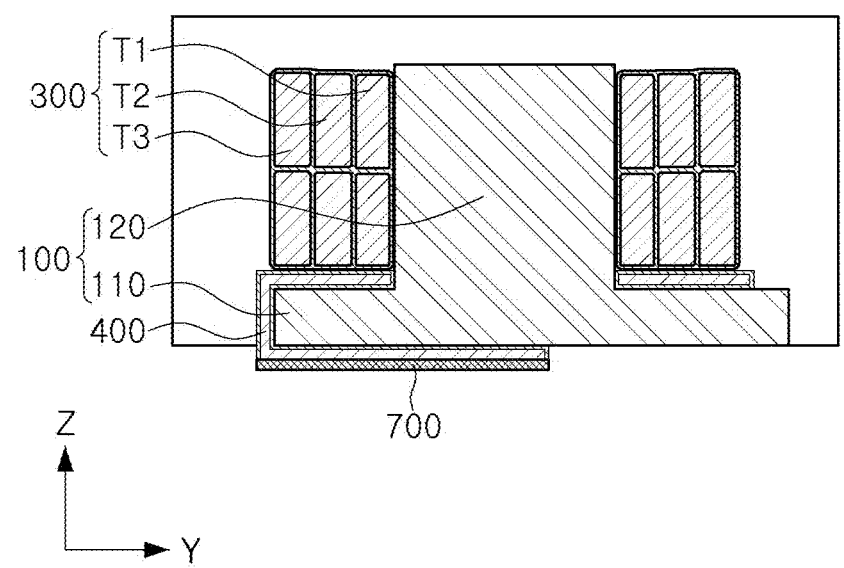
FIG. 4 is a view illustrating a cross-sectional view taken along line II-II' of FIG. 1.

FIG. 1 is a diagram schematically illustrating a coil component according to a first embodiment. FIG. 2 is an exploded perspective view of FIG. 1. FIG. 3 is a diagram illustrating a cross-sectional view taken along line I-I' of FIG. 1. FIG. 4 is a diagram illustrating a cross-sectional view taken along line II-II' of FIG. 1.

Referring to FIGS. 1 to 4, a coil component 1000 according to the first embodiment includes a body B, receiving grooves h1 and h2, a wound coil 300, and a first noise removing portion 400, and further includes first and second external electrodes 610 and 620 and a third external electrode 700. The body B includes a molded portion 100 and a cover portion 200. The molded portion 100 may include a core 120.

The body B forms the exterior of the coil component 1000 according to the present embodiment, and the wound coil 300 is embedded therein.

The body B may be formed as a whole in the shape of a hexahedron.

The body B includes a first surface 101 and a second surface 102 opposing each other in a longitudinal direction X, and a third surface 103 and a fourth surface 104 opposing each other in a width direction Y, and a fifth surface 105 and a sixth surface 106 opposing each other in a thickness direction Z.

The body B is formed in such a manner that the coil component 1000 according to the present embodiment in which external electrodes 610 and 620 to be described later are formed has a length of 2.0 mm, a width of 1.2 mm, and a thickness of 0.65 mm, but the configuration is not limited thereto.

On the other hand, the body B includes the molded portion 100 and the cover portion 200, and the cover portion 200 is disposed on an upper portion of the molded portion 100, to surround all surfaces except for a lower surface of the molded portion, based on FIG. 1. Accordingly, the first to fifth surfaces 101, 102, 103, 104 and 105 of the body B are formed by the cover portion 200, and the sixth surface 106 of the body B is formed by the molded portion 100 and the cover portion 200.

The molded portion 100 has one surface 112 and an other surface 114 opposing each other with side surfaces 116 connecting the one surface 112 and the other surface 114. The molded portion 100 includes a support portion 110 and a core 120. The support portion 110 has one surface 112 and an other surface 114 opposing each other. The core 120 is disposed on a central portion of the other surface 114 of the support portion 110, in a form penetrating through the wound coil 300. Therefore, in this specification, the one surface 112 and the other surface 114 of the molded portion 100 are used with the same meaning as the one surface 112 and the other surface 114 of the support portion 110, respectively.

The thickness of the support portion 110 may be 200 μm or more. If the thickness of the support portion 110 is less than 200 μm, securing rigidity may be difficult. The thickness of the core 120 may be 150 μm or more, but is not limited thereto.

The cover portion 200 covers the molded portion 100, and the wound coil 300 to be described later. The cover portion 200 may be disposed on the support portion 110 and the core 120 of the molded portion 100, and the wound coil 300, and may then be pressed to be coupled to the molded portion 100.

At least one of the molded portion 100 and the cover portion 200 includes a magnetic material. In the case of the embodiment of FIG. 1, both the molded portion 100 and the cover portion 200 include a magnetic material. The molded portion 100 may be formed by filling a mold for forming the molded portion 100 with a magnetic material. Alternatively, the molded portion 100 may be formed by filling a mold with a composite material including a magnetic material and an insulating resin.

The magnetic material may be ferrite or magnetic metal powder.

Ferrite powder particles may be at least one or more of, for example, spinel type ferrites such as Mg—Zn-based, Mn—Zn-based, Mn—Mg-based, Cu—Zn-based, Mg—Mn—Sr-based and Ni—Zn-based ferrites, hexagonal ferrites such as Ba—Zn-based, Ba—Mg-based, Ba—Ni-based, Ba—Co-based and Ba—Ni—Co-based ferrites, garnet type ferrites such as Y series, and Li ferrites.

The magnetic metal powder may include one or more selected from the group consisting of iron (Fe), silicon (Si), chromium (Cr), cobalt (Co), molybdenum (Mo), aluminum (Al), niobium (Nb), copper (Cu) and nickel (Ni). For example, the magnetic metal powder may be at least one or more of pure iron powder, Fe—Si alloy powder, Fe—Si—Al alloy powder, Fe—Ni alloy powder, Fe—Ni—Mo alloy powder, Fe—Ni—Mo—Cu alloy powder, Fe—Co alloy powder, Fe—Ni—Co alloy powder, Fe—Cr alloy powder, Fe—Cr—Si alloy powder, Fe—Si—Cu—Nb alloy powder, Fe—Ni—Cr alloy powder, and Fe—Cr—Al alloy powder.

The magnetic metal powder may be amorphous or crystalline. For example, the magnetic metal powder may be a Fe—Si—B—Cr-based amorphous alloy powder, but is not limited thereto.

Ferrite and magnetic metal powder may each have particles with an average diameter of about 0.1 μm to 30 μm, but are not limited thereto.

Each of the molded portion 100 and the cover portion 200 may include two or more types of magnetic materials. In this case, that the magnetic materials are of different types means that the magnetic materials are distinguished from each other by any one of an average diameter, composition, crystallinity, and shape.

The insulating resin may include, but is not limited to, epoxy, polyimide, liquid crystal polymer, or the like alone or as a mixture.

The wound coil 300 is embedded in the body B to express the characteristics of the coil component 1000. For example, when the coil component 1000 of the present embodiment is used as a power inductor, the wound coil 300 may serve to stabilize the power of an electronic device by storing an electric field as a magnetic field and maintaining an output voltage.

The wound coil 300 is disposed between the molded portion 100 and the cover portion 200, for example, on the other surface of the molded portion 100. In detail, the wound coil 300 is wound around the core 120 and is disposed on the other surface of the support portion 110.

The wound coil 300 is an air-core coil, and may be comprised of a flat coil. The wound coil 300 may be formed by winding a metal wire such as a copper wire of which the surface is coated with an insulating material in a spiral shape. In this case, the insulating material may function as a dielectric layer as the wound coil 300 and the first noise removing portion 400 are capacitively coupled to each other.

The wound coil 300 may be comprised of a plurality of layers. Each layer of the wound coil 300 is formed in a planar spiral, and may have a plurality of turns. For example, the wound coil 300 forms an innermost turn T1, at least one intermediate turn T2, and an outermost turn T3, outwardly from the center of the other surface of the mold 100.

On the other hand, the first insulating layer 310 is disposed between the wound coil 300 and the first noise removing portion 400 to be described later. Referring to FIG. 3, the first insulating layer 310 may be disposed along the respective surfaces of a plurality of turns of the wound coil 300. The first insulating layer 310 is to protect and insulate a plurality of turns of each wound coil 300, and may include a known insulating material such as parylene. Any insulating material included in the first insulating layer 310 may be used, and there is no particular limitation. The first insulating layer 310 may be formed by a method such as vapor deposition or the like, but the method is not limited thereto. In this case, the first insulating layer 310 functions as a dielectric layer as the wound coil 300 and the first noise removing portion 400 are capacitively coupled to each other.

The first and second receiving grooves h1 and h2 are formed to be spaced apart from each other in one surface of the body B. The receiving grooves h1 and h2 may be disposed outside of a region corresponding to the core 120 in the one surface of the body B. To secure the magnetic flux area, the positions of the first and second receiving grooves h1 and h2 may be outside of the region corresponding to the core 120 in one surface of the body B.

The first and second receiving grooves h1 and h2 may respectively have a shape extending in the width direction of the body B in one surface of the body B. In an embodiment, since the body B is an area including the molded portion 100 and the cover portion 200, one surface of the body B refers to one surface of the area including the molded portion 100 and the cover portion 200. The first and second receiving grooves h1 and h2 are disposed in one surface of the body B, and thus, are not limited to being disposed in the molded portion 100, and may also be formed in an area in which the cover portion 200 is formed in one surface of the body B. One end of the wound coil 300 is disposed in the first receiving groove h1 and the other end of the wound coil 300 is disposed in the second receiving groove h2, to be spaced apart from each other. The first and second receiving grooves h1 and h2 are regions in which both ends of the wound coil 300 are led out to the first and second external electrodes 610 and 620, and thus, may be spaced apart from each other in one surface of the body B, to correspond to the first and second external electrodes 610 and 620, respectively.

The first and second receiving grooves h1 and h2 may also be formed in a process of forming the molded portion 100.

When the first and second receiving grooves h1 and h2 are formed by filling a mold for forming the molded portion 100 with a magnetic material, a pair of first and second through-grooves H1 and H2 penetrating through the support portion 110 may be formed, and both ends of the wound coil 300 may be disposed in the first and second through-grooves H1 and H2, respectively. As an example, in this embodiment, the first and second through-grooves H1 and H2 and the first and second receiving grooves h1 and h2 are integrally formed, such that the first and second through-grooves H1 and H2 and the first and second receiving grooves h1 and h2 may be disposed in the molded portion 100.

Both ends of the wound coil 300 are exposed to the one surface of the support portion 110, for example, to the sixth surface 106 of the body B. Both ends of the wound coil 300, exposed to one surface of the support portion 110, are disposed in the first and second receiving grooves h1 and h2 formed to be spaced apart from each other in one surface of the body B.

For example, both ends of the wound coil 300 may penetrate through the support portion 110 of the molded portion 100 and be exposed to the one surface of the support portion 110. Although not specifically illustrated, both ends of the wound coil 300 are the same as the thickness of the wound coil 300 and may have a shape protruding from the other surface of the support portion 110 by the thickness of the wound coil 300. However, in the process of polishing the openings of the plating resist for forming the external electrodes 610 and 620 to be described later, the protruding ends may also be polished, so that the ends of the wound coil 300 exposed to one surface of the support portion 110 may be substantially less than the thickness of the wound coil 300.

The first noise removing portion 400 is disposed in the body 100 to discharge noise transmitted to the component and/or noise generated from the component to a mounting substrate and the like.

Referring to FIG. 4, the first noise removing portion 400 may be embedded in the body 100 and disposed below the wound coil 300, and one end thereof may be exposed to the surface of the body 100. In this embodiment, the first noise removing portion 400 is formed between the wound coil 300 and the other surface 114 of the molded portion 100. The first noise removing portion 400 includes an end 450 exposed to the one surface 112 of the molded portion 100.

The first noise removing portion 400 forms a turn to correspond to an area in which the wound coil 300 is disposed. In addition, the thickness of the first noise removing portion 400 may be less than the width thereof. As a result, by relatively increasing the volume occupied by the wound coil 300 in the body 100, high capacity and low DC resistance characteristics may be implemented.

In the case of a related art coil component that does not include a noise removing portion in the component, a signal having a relatively low frequency from a direct current may pass well, but the noise removal effect rapidly deteriorates at a frequency equal to or higher than the self-resonance frequency (SRF). Meanwhile, in the case of the present embodiment in which the noise removing portion 400 is formed adjacent to the wound coil 300, while passing a signal of relatively low frequency from a direct current well, unnecessary relatively higher frequency noise is effectively prevented when compared with the related art coil component.

The first noise removing portion 400 may include a conductive material such as copper (Cu), aluminum (Al), silver (Ag), tin (Sn), gold (Au), nickel (Ni), lead (Pb), titanium (Ti), or alloys thereof, but the present disclosure is not limited thereto. The first noise removing portion 400 may be formed by a method including at least one of a vapor deposition method such as an electroless plating method, an electroplating method, and sputtering, and an etching method, but the forming method is not limited thereto.

On the other hand, the second insulating layer 430 is disposed between the wound coil 300 and the first noise removing portion 400. Referring to FIG. 3, the second insulating layer 430 may be disposed along the surface of the first noise removing portion 400. The second insulating layer 430 is provided to protect and insulate the turn of the first noise removing portion 400, and may include a known insulating material such as parylene. Any insulating material included in the second insulating layer 430 may be used, and there is no particular limitation thereon. The second insulating layer 430 may be formed by a method such as vapor deposition, but the forming method is not limited thereto. In this case, the second insulating layer 430 functions as a dielectric layer since the wound coil 300 and the first noise removing portion 400 are capacitively coupled to each other.

The first and second external electrodes 610 and 620 may be spaced apart from each other on one surface of the body B, for example, on the sixth surface 106. In detail, the first and second external electrodes 610 and 620 are disposed to be spaced apart from each other on one surface of the support portion 110 and may be integrally formed by being connected to both ends of the wound coil 300, respectively.

The first and second external electrodes 610 and 620 may be formed in a single layer or multiple layer structure. For example, the first and second external electrodes 610 and 620 may be comprised of a first layer (not illustrated) containing copper (Cu), a second layer (not illustrated) disposed on the first layer and containing nickel (Ni), and a third layer (not illustrated) disposed on the second layer and including tin (Sn). The first and second external electrodes 610 and 620 may be formed by electroplating, but the forming method is not limited thereto.

The first and second external electrodes 610 and 620 may be formed of a conductive material such as copper (Cu), aluminum (Al), silver (Ag), tin (Sn), gold (Au), nickel (Ni), lead (Pb), chromium (Cr), titanium (Ti), or alloys thereof, but the material thereof is not limited thereto.

The first and second external electrodes 610 and 620 electrically connect the coil component 1000 to a mounting board when the coil component 1000 according to the present embodiment is mounted on a mounting board such as a printed circuit board. As an example, the coil component 1000 according to the present embodiment may be mounted such that the sixth surface 106 of the body B faces the upper surface of the printed circuit board, and the first and second external electrodes 610 and 620 that are formed to extend to the sixth surface 106 of the body B, and connection portions of the printed circuit board, may be electrically connected by a conductive coupling member such as solder or the like.

The third external electrode 700 is disposed on the sixth surface 106 of the body B to be spaced apart from the first and second external electrodes 610 and 620, and is connected to one end 450 of the first noise removing portion. For example, the third external electrode 700 is connected to one end 450 of the first noise removing portion 400 and is connected to a ground such as a mounting board or the like.

The third external electrode 700 may include at least one of a conductive resin layer and an electroplating layer. The conductive resin layer may be formed by paste printing or the like, and may include any one or more conductive metals selected from the group consisting of copper (Cu), nickel (Ni), and silver (Ag), and a thermosetting resin. The electroplating layer may include at least one selected from the group consisting of nickel (Ni), copper (Cu), and tin (Sn).

First Modified Example of First Embodiment

Figure 5:
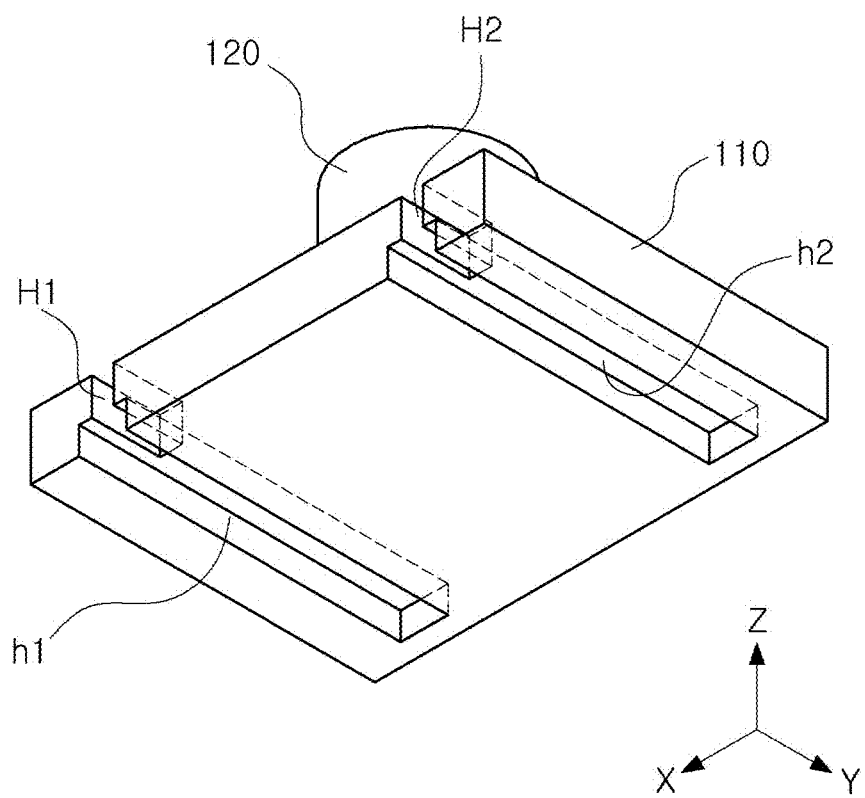
FIG. 5 is a perspective view of a molded portion applied to the first modified example of the first embodiment as viewed from the bottom.

FIG. 5 is a perspective view of a molded portion applied to a first modified example of the first embodiment as viewed from the bottom.

Referring to FIG. 5, a coil component according to the present modified example has a different arrangement structure of receiving grooves h1 and h2 as compared to those of the coil component according to the first embodiment. Therefore, in describing the present modified example, only the arrangement structure of the receiving grooves h1 and h2 different from the first embodiment will be described. For the rest of the configuration of this modification, the description in the first embodiment may be applied as it is.

Both ends of the wound coil 300 may be disposed in the first and second receiving grooves h1 and h2 through side surfaces 116 of the molded portion 100, respectively.

Referring to FIG. 5, through-grooves H1 and H2 may be formed in one side of the molded portion 100. The receiving grooves h1 and h2 formed in one surface of the molded portion 100 may extend to one side of the molded portion 100 to be connected to the through-grooves H1 and H2 formed in one side of the molded portion 100. Referring to FIG. 5, the width of the receiving groove (h1, h2) is illustrated greater than the width of the through-groove (H1, H2), but the form in which the end of the wound coil 300 is disposed in the receiving groove (h1, h2) is not limited, and thus, the width of the receiving groove (h1, h2) may be the same as the width of the through-groove (H1, H2).

The receiving grooves h1 and h2 and the through-grooves H1 and H2 may be formed in the molded portion 100 in a process of laminating and pressing a magnetic sheet including a magnetic material on the molded portion 100. For example, both ends of the wound coil 300 protruding from the side and one surface of the molded portion 100 are embedded inside the molded portion 100 in the magnetic sheet pressing process. Alternatively, as described above, the receiving grooves h1 and h2 and the through-grooves H1 and H2 may be formed in a process of forming the molded portion 100 using a mold. In this case, in the mold used to form the molded portion 100, protruding portions corresponding to the receiving grooves h1 and h2 and the through-grooves H1 and H2 may be formed.

Second Modified Example of First Embodiment

Figure 6:
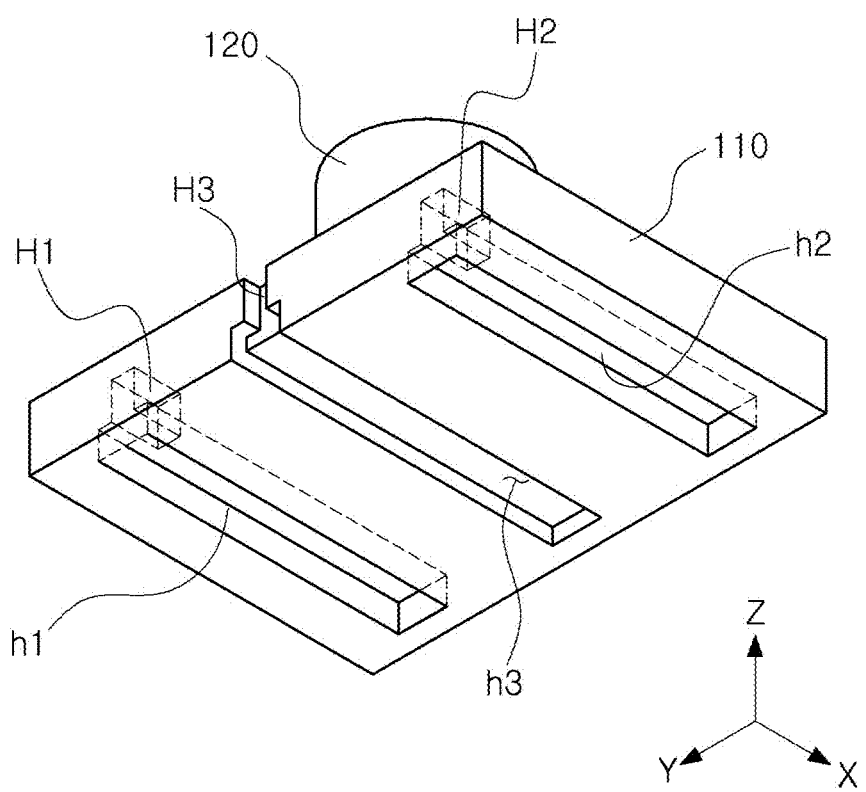
FIG. 6 is a view of the molded portion applied to a second modified example of the first embodiment as viewed from the bottom.
Figure 7:
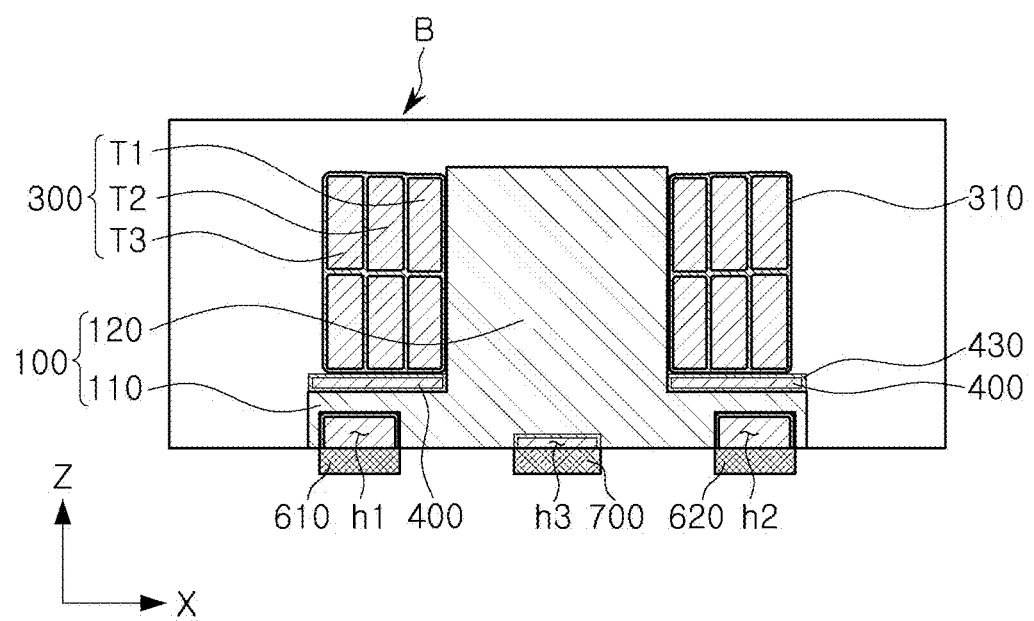
FIG. 7 schematically illustrates a coil component according to the second modified example of the first embodiment, and is a view corresponding to a cross-sectional view taken along line I-I' of FIG. 1.
Figure 8:
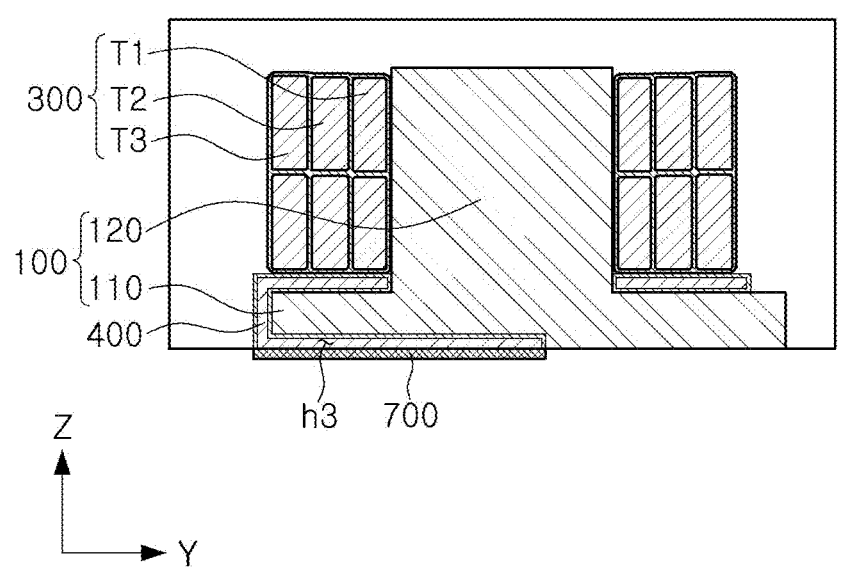
FIG. 8 schematically illustrates a coil component according to the second modified example of the first embodiment, and corresponds to a cross-sectional view taken along line II-II' of FIG. 1.

FIG. 6 is a view as viewed from the bottom of a molded portion applied to a second modified example of the first embodiment. FIG. 7 schematically illustrates a coil component according to a second modified example of the first embodiment, and is a view corresponding to a cross-sectional view taken along line I-I' of FIG. 1. FIG. 8 schematically illustrates a coil component according to the second modified example of the first embodiment, and is a view corresponding to a cross-sectional view taken along line II-II' of FIG. 1.

Referring to FIGS. 6 to 8, the coil component according to the present modified example differs in the presence or absence of a third receiving groove h3 as compared to the coil component according to the first embodiment. Accordingly, in describing this modified example, only the third receiving groove h3 different from the first embodiment will be described. For the rest of the configuration of this modification, the description in the first embodiment may be applied as it is.

The third receiving groove h3 is formed to be spaced apart from other receiving grooves in one surface of the body B. In this embodiment, the third receiving groove h3 is disposed to be spaced apart from the first and second receiving grooves h1 and h2 in one surface 112 of the molded portion 100. The third receiving groove h3 accommodates one end 450 of the first noise removing portion 400.

The third receiving groove h3 may have a shape extending in the width direction of the body B in one surface of the body B. The third receiving groove h3 is disposed in one surface of the body B, and thus, is not limited to being disposed in the molded portion 100, and may also be disposed in an area in which the cover portion 200 is formed in one surface of the body B. The third receiving groove h3 is an area in which one end 450 of the first noise removing portion 400 is led out to a third external electrode 700, and may thus be separated to respectively correspond to the third external electrode 700.

The third receiving groove h3 may also be formed in the process of forming the molded portion 100. In the case in which the third receiving groove h3 is formed by filling a mold for forming the molded portion 100 with a magnetic material, a third through-groove h3 penetrating through a support portion 110 is formed, and one end 450 of the first noise removing portion 400 may be disposed in the third through-groove H3. As an example, in this embodiment, the third through-groove H3 and the third receiving groove h3 are integrally formed so that the third through-groove H3 and the third receiving groove h3 may be disposed in the molded portion 100.

One end 450 of the first noise removing portion 400 is exposed to one surface 112 of the support portion 110, for example, to the sixth surface 106 of the body B. One end 450 of the first noise removing portion 400 exposed to one surface 112 of the support portion 110 is disposed in the third receiving groove h3 formed in one surface of the body B.

For example, one end 450 of the first noise removing portion 400 may penetrate through the support portion 110 of the molded portion 100 and be exposed to one surface 112 of the support portion 110. Although not specifically illustrated, one end 450 of the first noise removing portion 400 is the same as the thickness of the first noise removing portion 400 to have a shape protruding by a degree corresponding to the thickness of the first noise removing portion 400 to the other surface of the support portion 110. However, in the process of polishing the opening of the plating resist for forming the third external electrode 700, to be described later, the protruding end may also be polished, so that the end 450 of the first noise removing portion 400 exposed to one surface of the support portion 110 may be substantially smaller than the thickness of the first noise removing portion 400.

One end 450 of the first noise removing portion 400 may be disposed in the third receiving groove h3 through a side surface 116 of the molded portion 100. Referring to FIGS. 6 and 8, the third through-groove H3 may be formed in one side of the molded portion 100. The third receiving groove h3 formed in one surface of the molded portion 100 may extend to one side of the molded portion 100 to be connected to the third through-groove H3 formed in one side of the molded portion 100.

Third Modified Example of First Embodiment

Figure 9:
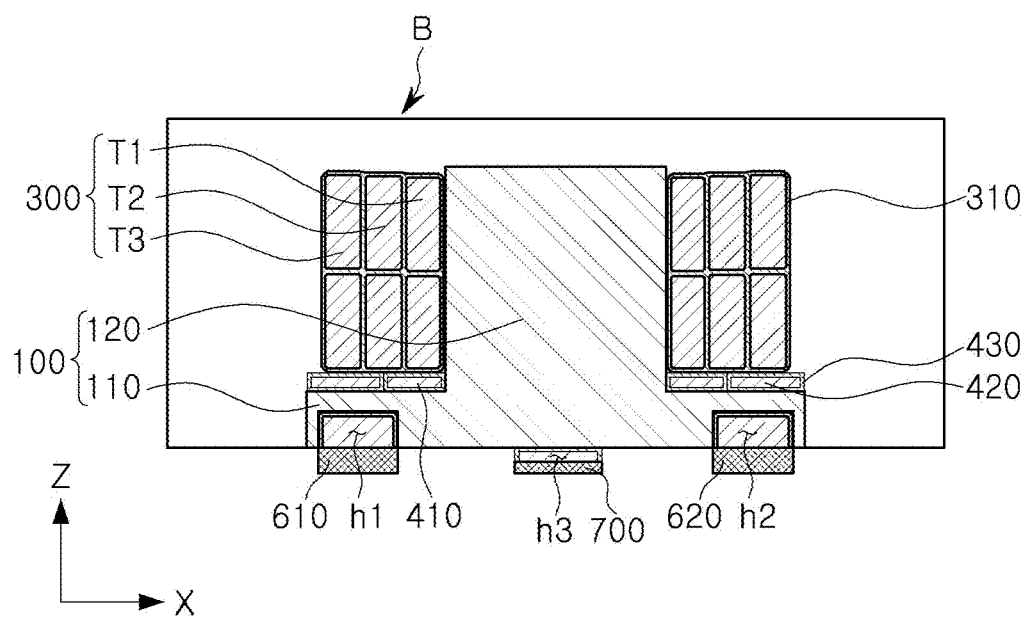
FIG. 9 schematically illustrates a coil component according to a third modified example of the first embodiment, and corresponds to a cross-sectional view taken along line I-I' of FIG. 1.
Figure 10:
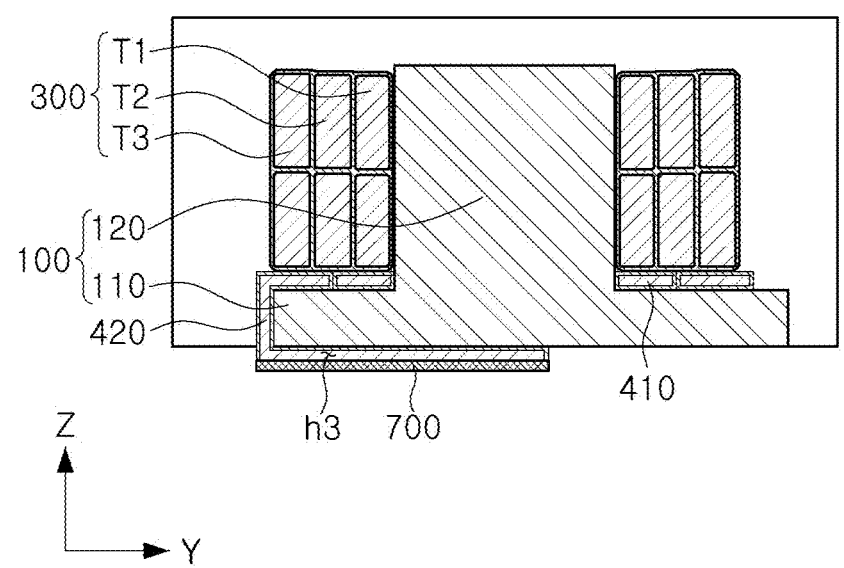
FIG. 10 schematically illustrates a coil component according to a third modified example of the first embodiment, and corresponds to a cross-sectional view taken along line II-II' of FIG. 1.

FIG. 9 schematically illustrates a coil component according to a third modified example of the first embodiment, and is a view corresponding to a cross-sectional view taken along line I-I' of FIG. 1. FIG. 10 schematically illustrates a coil component according to the third modified example of the first embodiment, and is a view corresponding to a cross-sectional view taken along line II-II' of FIG. 1.

Referring to FIGS. 9 and 10, a coil component according to the present modification has a different number of turns of a first noise removing portion 400 as compared to that of the coil component according to the first embodiment. Therefore, in describing this modified example, only the first noise removing portion 400 different from the first embodiment will be described. For the rest of the configuration of this modification, the description in the first embodiment may be applied as it is.

The first noise removing portion 400 may have a plurality of turns. Referring to FIGS. 9 and 10, the first noise removing portion 400 may have a first noise removal pattern 410 adjacent to an innermost turn of the wound coil 300, and a second noise removal pattern 420 adjacent to an outermost turn of the wound coil 300. For example, in this case, compared to the case of configuring the first noise removing portion 400 with one turn, the first and/or second noise removal patterns 410 and 420 having a relatively small area may be wound a plurality of times. Although not specifically illustrated, only the first noise removal pattern 410 or the second noise removal pattern 420 may be wound, and in this case, compared to the case of configuring the first noise removing portion 400 with one turn, the volume occupied by the noise removing portion in the component may be reduced. As a result, the inductance characteristics of the coil component may be improved, and at the same time, the design freedom of the noise removing portion may be diversified.

Second Embodiment

Figure 11:
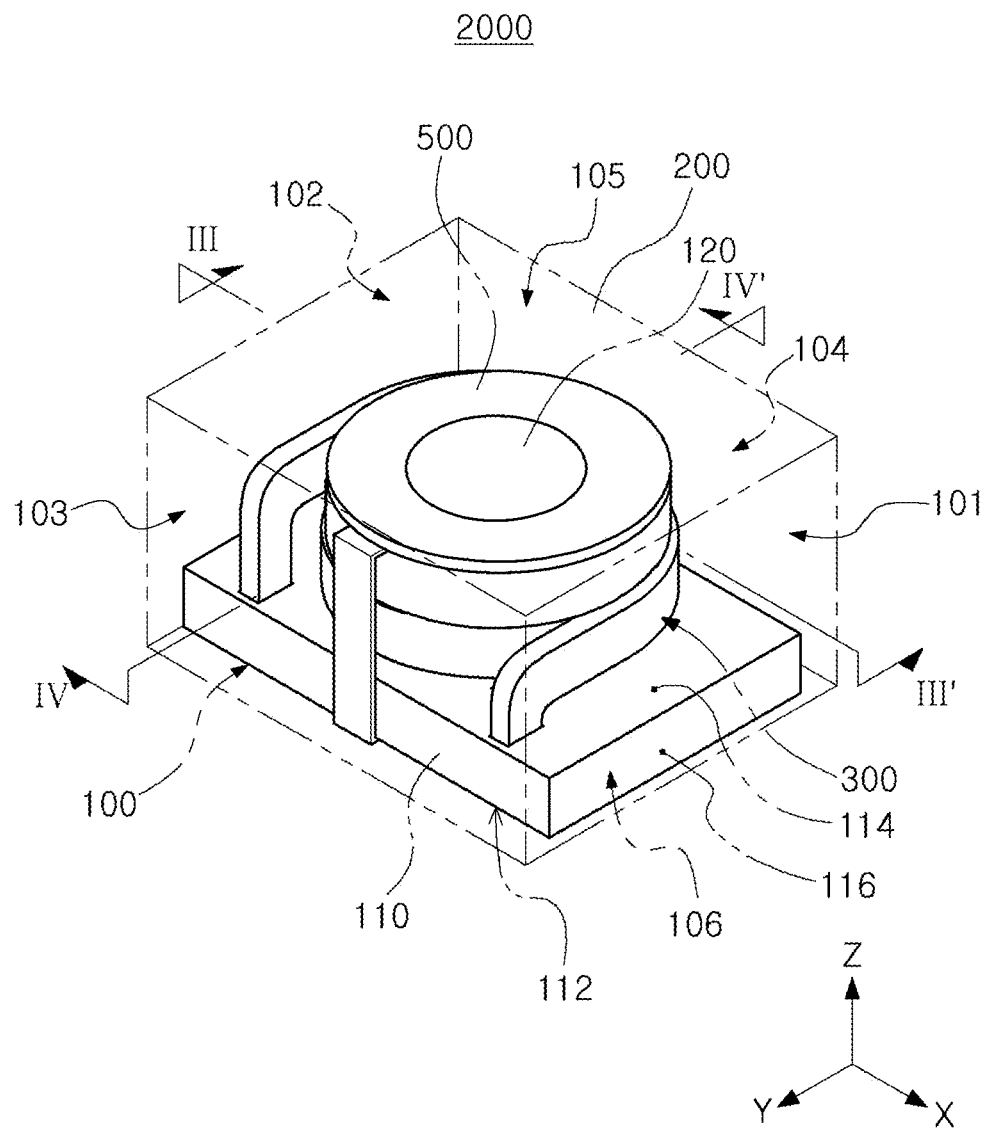
FIG. 11 is a view schematically illustrating a coil component according to a second embodiment.
Figure 12:
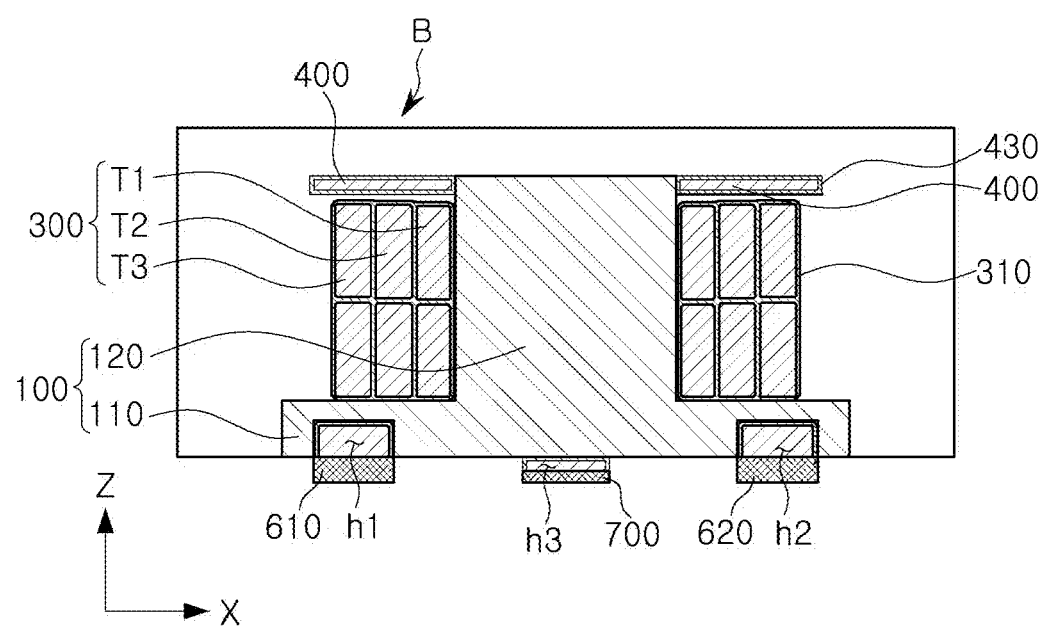
FIG. 12 is a view illustrating a cross-sectional view taken along line III-III' of FIG. 11.
Figure 13:
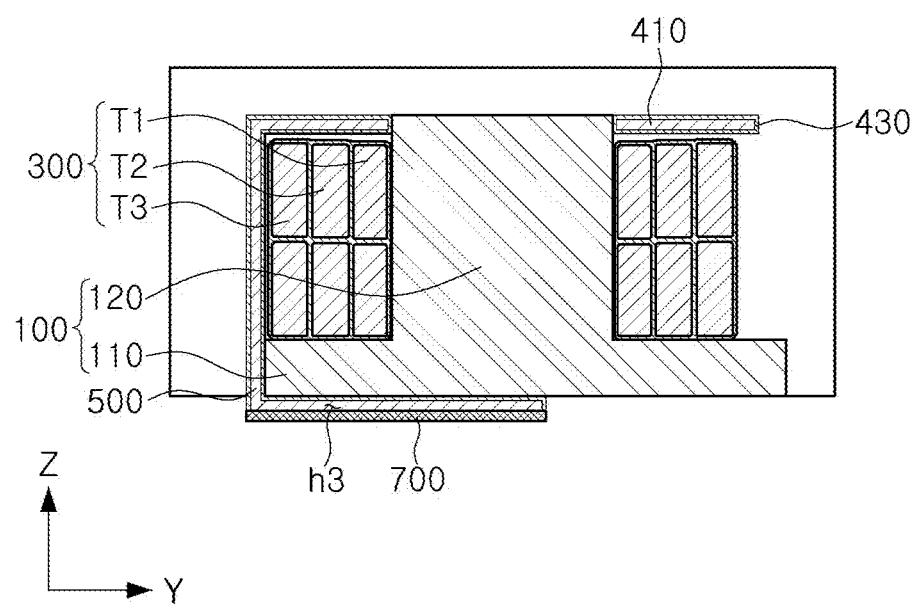
FIG. 13 is a view illustrating a cross-sectional view taken along line IV-IV' of FIG. 11.

FIG. 11 is a view schematically illustrating a coil component according to a second embodiment. FIG. 12 is a diagram illustrating a cross-sectional view taken along line III-III' of FIG. 11. FIG. 13 is a diagram illustrating a cross-sectional view taken along line IV-IV' of FIG. 11.

Referring to FIGS. 11 to 13, a coil component according to the present embodiment has a difference from the coil component according to the first embodiment in that a second noise removing portion 500 is included to be disposed on an upper portion of the wound coil 300. Accordingly, in describing the present embodiment, only first and second noise removing portions 400 and 500 different from the first embodiment will be described. For the rest of the configuration of the present embodiment, the description in the first embodiment may be applied as it is.

The coil component of this embodiment includes the second noise removing portion 500 on the upper portion of the wound coil 300, and in detail, includes the second noise removing portion 500 that is disposed between the wound coil 300 and the cover portion 200 to face the other surface of the molded portion 100.

In this embodiment, a third receiving groove h3 is disposed to be spaced apart from the first and second receiving grooves h1 and h2 in one surface of the molded portion 100 to receive one end of the second noise removing portion 500. One end of the second noise removing portion 500 may be disposed in the third receiving groove h3 through a side surface 116 of the molded portion 100.

Third Embodiment

Figure 14:
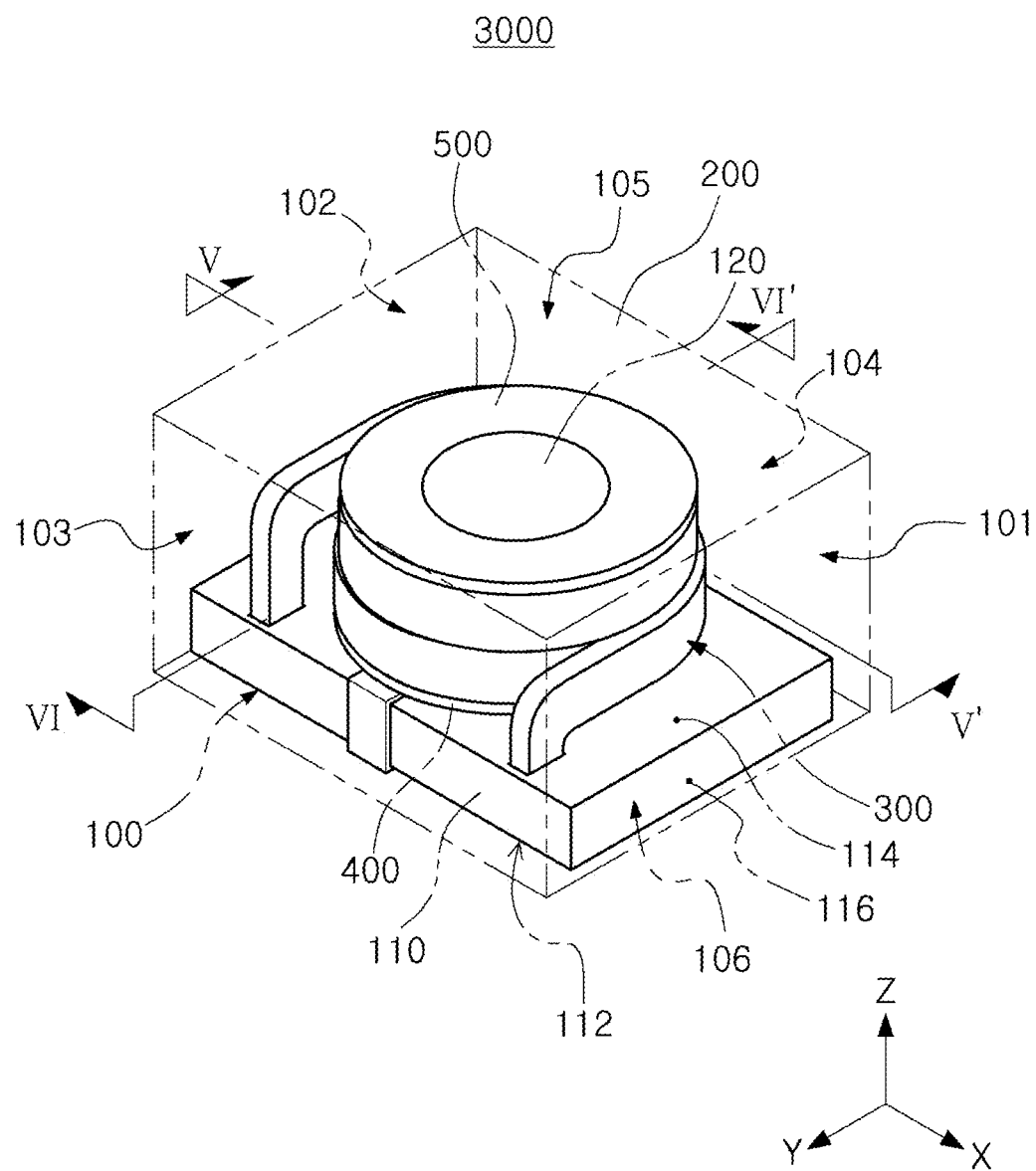
FIG. 14 is a view schematically illustrating a coil component according to a third embodiment.
Figure 15:
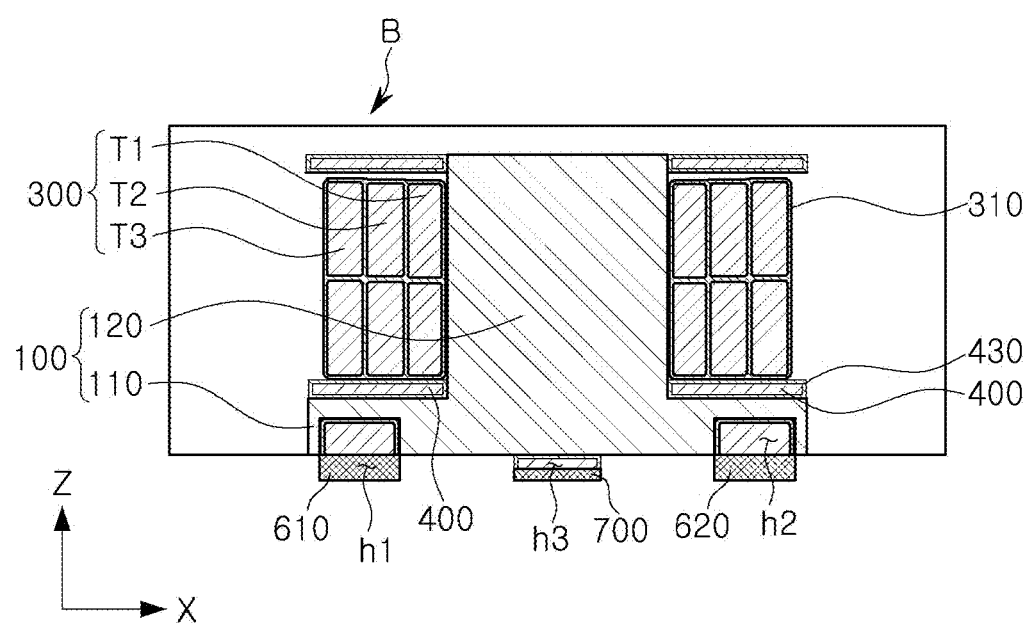
FIG. 15 is a diagram illustrating a cross-sectional view taken along line V-V' of FIG. 14.
Figure 16:
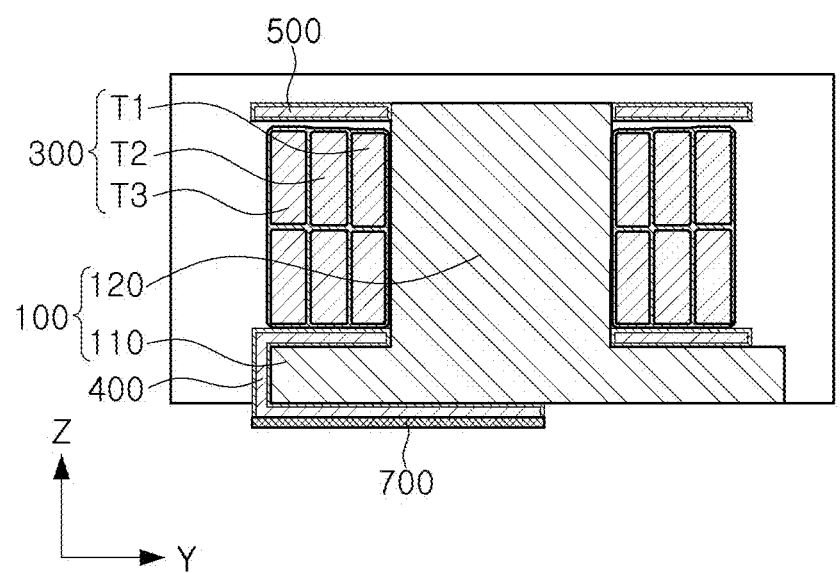
FIG. 16 is a view illustrating a cross-sectional view taken along line VI-VI' of FIG. 14.

FIG. 14 is a diagram schematically illustrating a coil component according to a third embodiment. FIG. 15 is a diagram illustrating a cross-sectional view taken along line V-V' of FIG. 14. FIG. 16 is a diagram illustrating a cross-sectional view taken along line VI-VI' of FIG. 14.

Referring to FIGS. 14 to 16, a coil component according to the present embodiment is different from the coil component according to the first embodiment in that the coil component according to the present embodiment further includes a second noise removing portion 500. Therefore, in describing the present embodiment, only the second noise removing portion 500 different from the first embodiment will be described. For the rest of the configuration of the present embodiment, the description in the first embodiment may be applied as it is.

The coil component of this embodiment further includes the second noise removing portion 500 on an upper portion of the wound coil 300, and in detail, further includes the second noise removing portion 500 that is disposed between the wound coil 300 and the cover portion 200 to face the other surface of the molded portion 100.

As set forth above, according to an exemplary embodiment, noise may be easily removed.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A coil component comprising:
a body including a molded portion comprising a core, and a cover portion disposed on the molded portion, the molded portion having a first surface and a second surface opposing each other and a side surface connecting the first surface and the second surface;
first and second receiving grooves disposed in the first surface of the molded portion to be spaced apart from each other and disposed outside of a region corresponding to the core, in the first surface of the molded portion;
a wound coil disposed between the second surface of molded portion and the cover portion, and wound around the core, both ends of the wound coil being disposed in the first and second receiving grooves, respectively; and
a first noise removing portion disposed between the wound coil and the second surface of the molded portion, and having a first end extending to the first surface of the molded portion.

2. The coil component of claim 1, wherein a thickness of the first noise removing portion is less than a width thereof.

3. The coil component of claim 1, further comprising a third receiving groove disposed in the first surface of the molded portion to be spaced apart from the first and second receiving grooves, to receive the first end of the first noise removing portion.

4. The coil component of claim 3, wherein the first noise removing portion is disposed in the third receiving groove through the side surface of the molded portion.

5. The coil component of claim 1, further comprising a second noise removing portion disposed between the wound coil and the cover portion, to face the second surface of the molded portion.

6. The coil component of claim 1, wherein both ends of the wound coil respectively penetrate through the molded portion.

7. The coil component of claim 1, wherein both ends of the wound coil are disposed in the first and second receiving grooves through the side surfaces of the molded portion, respectively.

8. The coil component of claim 1, wherein each of the first and second receiving grooves has a shape extending in a width direction of the body in the first surface of the body.

9. The coil component of claim 1, wherein the wound coil has an innermost turn adjacent to the core, at least one intermediate turn, and an outermost turn.

10. The coil component of claim 9, wherein the first noise removing portion has a plurality of turns.

11. The coil component of claim 10, wherein the first noise removal portion further has a first noise removal pattern adjacent to the innermost turn of the wound coil, and a second noise removal pattern adjacent to the outermost turn of the wound coil.

12. The coil component of claim 1, further comprising first and second external electrodes disposed to be spaced apart from each other on a first surface of the body, and connected to both ends of the wound coil, respectively.

13. The coil component of claim 12, further comprising a third external electrode disposed on the first surface of the body and connected to the first end of the first noise removing portion.

14. A coil component comprising:
a body including a molded portion comprising a core, and a cover portion disposed on the molded portion, the molded portion having a first surface and a second other surface opposing each other;
first and second receiving grooves penetrating through the molded portion between the first and second surfaces thereof and disposed to be spaced apart from each other and outside of a region corresponding to the core;
a wound coil disposed between the molded portion and the cover portion, and wound around the core, wherein both ends of the wound coil penetrate through the first and second receiving grooves from the second surface to the first surface of the molded portion; and
a second noise removing portion disposed between the wound coil and the cover portion, to face the second surface of the molded portion.

15. The coil component of claim 14, further comprising a third receiving groove disposed on the first surface of the molded portion, to be spaced apart from the first and second receiving grooves, to receive a first end of the second noise removing portion.

16. A coil component comprising:
a wound coil disposed around a core and on a first surface of a molded portion, the molded portion having a second surface opposing the first surface;
lead out portions connecting first and second ends of the wound coil respectively to first and second external electrodes disposed on the second surface of the molded portion outside a region corresponding to the core;
a noise removing portion disposed on the first surface of the molded portion between the first surface and the wound coil, and extending to a corresponding external electrode disposed on the second surface of the molded portion, the noise removing portion comprising a conductor and having at least one turn around the core; and
a cover portion encapsulating the core, the wound coil and the noise removing portion.

17. The coil component of claim 16, wherein the noise removing portion is disposed between the first surface of the molded portion and the wound coil.

18. The coil component of claim 16, wherein the wound coil is disposed between the first surface of the molded portion and the noise removing portion.

19. The coil component of claim 16, wherein an insulating layer is disposed between the noise removing portion and the wound coil.

20. The coil component of claim 16, wherein a thickness of the noise removing portion is less than a width thereof.

* * * * *